United States Patent
Park

(10) Patent No.: US 11,392,326 B2
(45) Date of Patent: Jul. 19, 2022

(54) MEMORY DEVICE AND METHOD OF OPERATING THE MEMORY DEVICE

(71) Applicant: SK hynix Inc., Icheon-si (KR)

(72) Inventor: Kyu Tae Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/156,128

(22) Filed: Jan. 22, 2021

(65) Prior Publication Data

US 2022/0027091 A1 Jan. 27, 2022

(30) Foreign Application Priority Data

Jul. 23, 2020 (KR) .................. 10-2020-0091955

(51) Int. Cl.
| | |
|---|---|
| *G11C 29/00* | (2006.01) |
| *G06F 3/06* | (2006.01) |
| *G11C 11/56* | (2006.01) |
| *G11C 16/26* | (2006.01) |
| *G11C 16/04* | (2006.01) |

(52) U.S. Cl.
CPC .......... *G06F 3/0659* (2013.01); *G06F 3/0604* (2013.01); *G06F 3/0679* (2013.01); *G11C 11/5642* (2013.01); *G11C 11/5671* (2013.01); *G11C 16/0483* (2013.01); *G11C 16/26* (2013.01)

(58) Field of Classification Search
CPC ............................. G11C 16/26; G06F 3/0659
See application file for complete search history.

(56) References Cited

U.S. PATENT DOCUMENTS

| | | | | |
|---|---|---|---|---|
| 6,967,878 B2 * | 11/2005 | Dono | ................... | G11C 29/785 365/201 |
| 8,174,857 B1 * | 5/2012 | Sommer | ............. | G11C 11/5642 365/45 |
| 2012/0079330 A1 * | 3/2012 | Kawaguchi | ...... | G11C 29/56012 714/E11.17 |
| 2018/0366193 A1 * | 12/2018 | Das | ..................... | H01L 45/1233 |

FOREIGN PATENT DOCUMENTS

| KR | 1020070090376 A | 9/2007 |
|---|---|---|
| KR | 101686590 B1 | 12/2016 |

* cited by examiner

*Primary Examiner* — Min Huang
(74) *Attorney, Agent, or Firm* — William Park & Associates Ltd.

(57) ABSTRACT

Provided herein may be a memory device and a method of operating the same. The memory device may include a memory cell array including multiple planes, a peripheral circuit configured to perform an operation on the multiple planes, a control memory configured to store control codes for controlling the peripheral circuit, and a plurality of independent control logic configured to, when a command corresponding to each of the planes is received from a memory controller, control the peripheral circuit with reference to a control code corresponding to the command in response to the command. The control memory includes a common memory configured to be accessible in common by the plurality of independent control logic, and a temporary storage including areas respectively corresponding to the planes.

17 Claims, 17 Drawing Sheets

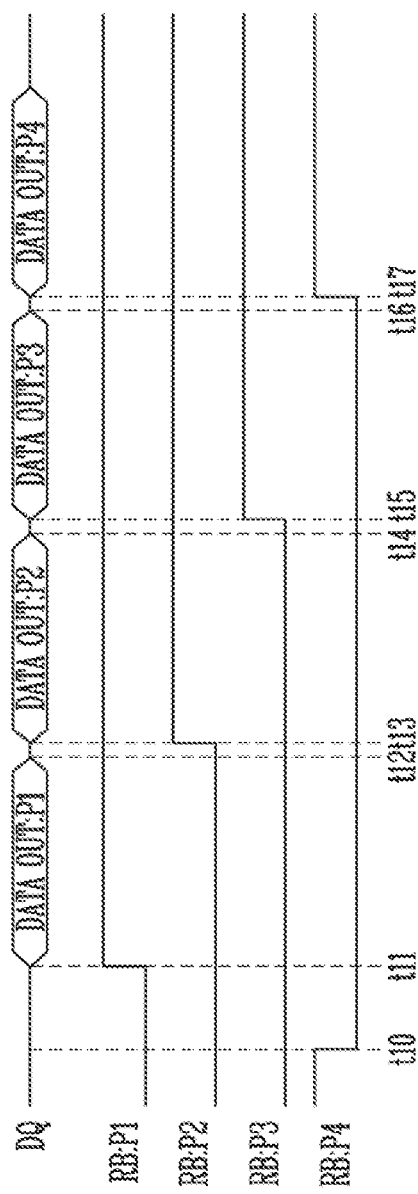

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0091955 filed on Jul. 23, 2020, in the Korean Intellectual Property Office, the entire disclosure of which is incorporated by reference herein.

BACKGROUND

1. Technical Field

Various embodiments of the present disclosure generally relate to a memory device, and more particularly to a memory device and a method of operating the memory device.

2. Related Art

A storage device is a device which stores data under the control of a host device such as a computer or a smartphone. The storage device may include a memory device in which data is stored and a memory controller which controls the memory device. Memory devices are classified into a volatile memory device and a nonvolatile memory device.

The volatile memory device is a memory device in which data is stored only when power is supplied and in which stored data is lost when the supply of power is interrupted. Examples of the volatile memory device may include a static random access memory (SRAM) and a dynamic random access memory (DRAM).

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

SUMMARY

An embodiment of the present disclosure may provide for a memory device. The memory device may include a memory cell array including multiple planes, a control memory configured to store a control code for performing a plane-interleaved operation on the multiple planes, and a plurality of independent control logic configured to, when a command indicating the plane-interleaved operation is received from a memory controller, control an operation corresponding to the command for each of the planes with reference to the control code in response to the command.

The control memory may include a common memory configured to be accessible in common by the independent control logic, and a temporary storage including physically independent areas so that the plurality of independent control logic are capable of accessing the areas in parallel.

An embodiment of the present disclosure may provide for a method of operating a memory device. The method may include receiving a command indicating a plane-interleaved operation from a memory controller, determining whether the command is a first command of the memory controller, accessing a common memory configured to be accessible in common by a plurality of independent control logic or a temporary storage in response to the determination, and then acquiring a control code corresponding to the command, storing the control code in the temporary storage, and generating a control signal for the plane-interleaved operation based on the control code.

BRIEF DESCRIPTION OF THE DRAWINGS

FIGS. 8A and 8B are timing diagrams illustrating a plane-interleaved read operation of a memory device having the multi-plane structure of FIG. 4.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that can efficiently utilize storage space and a method of operating the memory device. In some embodiments, a temporary storage may include physically independent areas so that the plurality of independent control logic are capable of accessing the areas in parallel. In some embodiments, a control code may be configured to, when the command is the first command of the memory controller, access the common memory and acquire the control code from the common memory. In some embodiments, the control code may be configured to, when the command is not a first command of the memory controller, access the temporary storage instead of the common memory and acquire the control code from the temporary storage.

Figure 1:
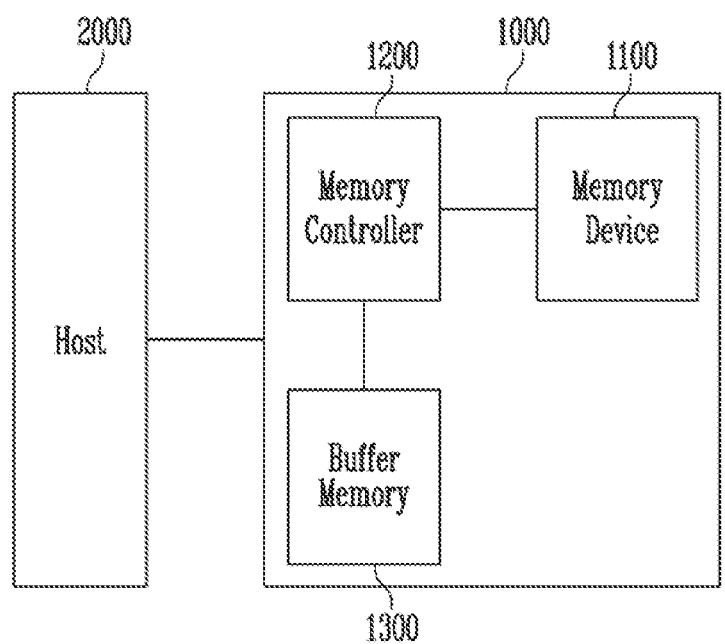
FIG. 1 is a diagram illustrating a memory system.

FIG. 1 is a diagram illustrating a memory system.

Referring to FIG. 1, a memory system 1000 may include a memory device 1100 which stores data, a buffer memory 1300 which temporarily stores data required for the operation of the memory system 1000, and/or a memory controller 1200 which controls the memory device 1100 and the buffer memory 1300 under the control of a host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory device 1100 may be implemented as a volatile memory device in which stored data is lost when the supply of power is interrupted or as a nonvolatile memory device in which stored data is retained even when the supply of power is interrupted. The memory device 1100 may perform a program operation, a read operation, or an erase operation under the control of the memory controller 1200. For example, during a program operation, the memory device 1100 may receive a command, an address, and data from the memory controller 1200, and may then perform the program operation. During a read operation, the memory device 1100 may receive a command and an address from the memory controller 1200, and may output read data to the memory controller 1200. For this operation, the memory device 1100 may include an input/output circuit for inputting and outputting data.

The memory controller 1200 may control the overall operation of the memory system 1000, and may control data exchange between the host 2000 and the memory device 1100. For example, the memory controller 1200 may program, read or erase data by controlling the memory device 1100 in response to a request received from the host 2000. Also, the memory controller 1200 may receive data and a logical address from the host 2000, and may translate the logical address into a physical address indicating the area of the memory device 1100 in which the data is to be actually stored. Further, the memory controller 1200 may store a logical-to-physical address mapping table, which configures mapping relationships between logical addresses and physical addresses, in the buffer memory 1300.

The memory device 1100 may include multiple planes. The memory controller 1200 may control the memory device 1100 so that a program operation, a read operation or an erase operation is performed on the multiple planes in parallel (or in an interleaved manner) in response to a request received from the host 2000. For example, the memory controller 1200 may control the memory device 1100 so that the memory device 1100 performs a plane-interleaved operation. The plane-interleaved operation may include a plane-interleaved read operation. The memory controller 1200 may generate a read command indicating a plane-interleaved read operation in response to a plurality of read requests received from the host 2000, and may output the generated read command to the memory device 1100. For example, the read command may include a physical address of a plane selected from among the multiple planes. The memory device 1100 may read pieces of data from the multiple planes in an interleaved manner in response to the read command, and may transfer the read data to the memory controller 1200. Hereinafter, although a description will be made based on a plane-interleaved read operation, the present disclosure is not limited thereto, and an embodiment in which the memory device 1100 includes a plurality of chips or dies and performs an interleaved operation on a chip or die basis may also be included in the present disclosure.

The buffer memory 1300 may be used as a working memory or a cache memory of the memory controller 1200, and may store system data that is used in the memory system 1000 in addition to the above-described information. In an embodiment, the buffer memory 1300 may include a double data rate synchronous dynamic random access memory (DDR SDRAM), DDR SDRAM fourth generation (DDR4 SDRAM), a low power DDR fourth generation (LPDDR4) SDRAM, a graphics double data rate (DDDR) SDRAM, a low power DDR (LPDDR) SDRAM, or a Rambus DRAM (RDRAM).

Figure 2:
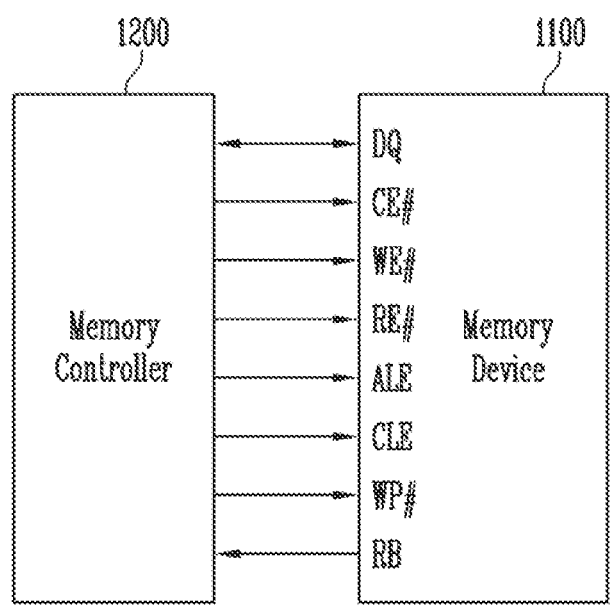
FIG. 2 is a diagram illustrating signals exchanged between a memory controller and a memory device.

FIG. 2 is a diagram illustrating signals exchanged between a memory controller and a memory device.

Referring to FIG. 2, the memory controller 1200 and the memory device 1100 may exchange commands, data and/or addresses with each other through an input/output pad DQ.

The memory device may receive a chip enable signal through a CE # pad, receive a write enable signal through a WE # pad, receive a read enable signal through an RE # pad, receive an address latch enable signal through an ALE pad, receive a command latch enable signal through a CLE pad, and receive a write protection signal through a WP # pad.

Further, the memory device 1100 may output a ready-busy signal to the memory controller 1200 through an RB pad. For example, when the memory device 110 includes multiple planes, the memory a device 1100 may output a plurality of ready-busy signals, each indicating one of a ready state and a busy state in which a corresponding one of the planes is present.

Figure 3:
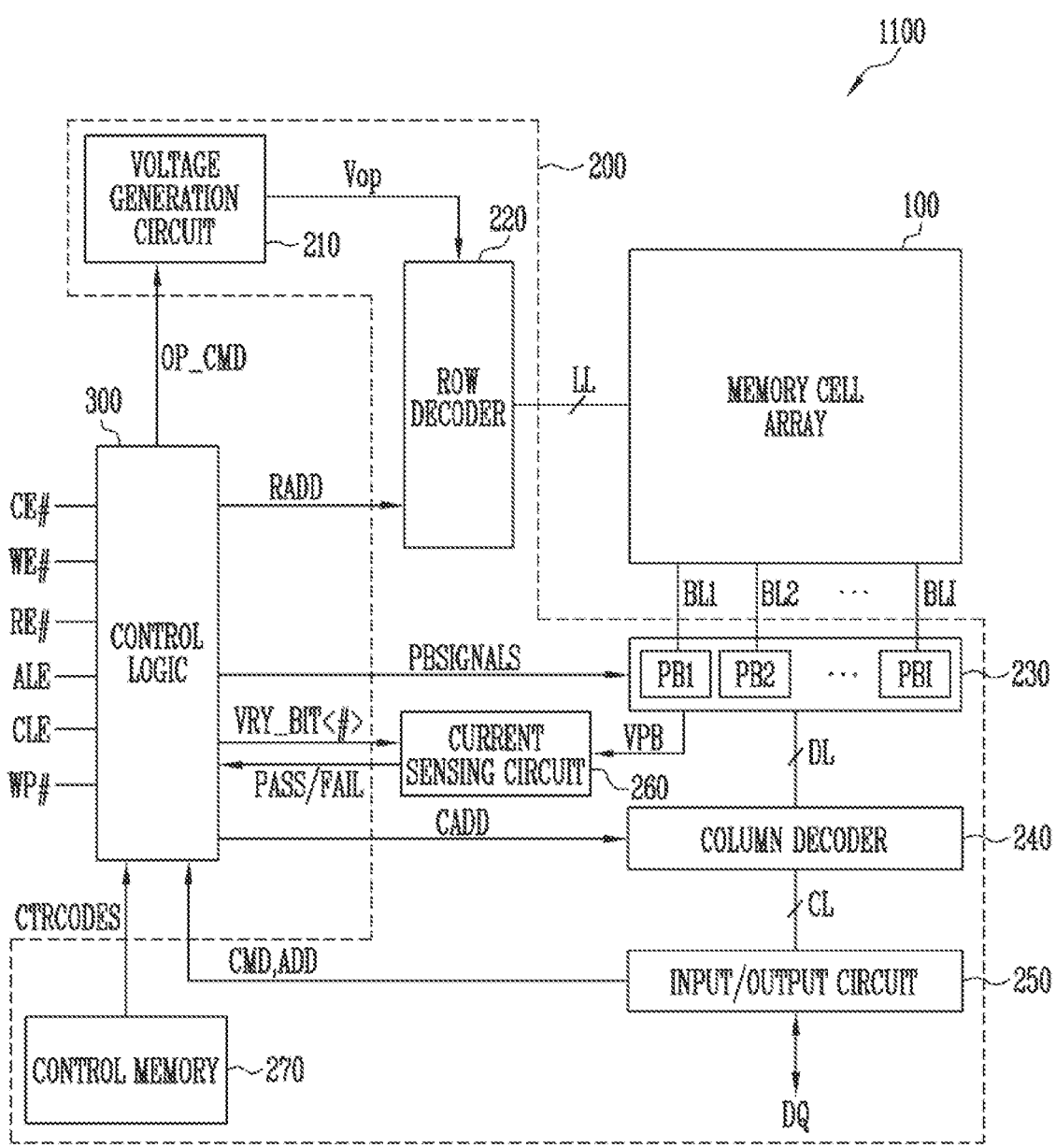
FIG. 3 is a diagram illustrating the memory device of FIG. 1.

FIG. 3 is a diagram illustrating the memory device of FIG. 1.

Referring to FIG. 3, the memory device 1100 may be implemented as a volatile memory device or a nonvolatile memory device. Although a nonvolatile memory device is illustrated as an example of the memory device in FIG. 3, the present embodiment is not limited to such a nonvolatile memory device.

The memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 which controls the peripheral circuit 200 under the control of the memory controller 1200. The control logic 300 may be implemented as hardware, software, or a combination of hardware and software. For example, the control logic 300 may be a control logic circuit operating in accordance with an algorithm and/or a processor executing control logic code.

The memory cell array 100 includes a plurality of memory cells in which data is stored. For example, the memory cell array 100 may include at least one plane, which may include one or more memory blocks. In an embodiment, a plane may be the unit of a memory area that is accessed when a program, read or erase operation is performed. Each of the memory blocks may include a plurality of memory cells. A structure in which multiple planes are included may be designated as a multi-plane structure. In the memory blocks, user data and information required for the operation of the memory device 1100 may be stored. The memory blocks may each be implemented in a two-dimensional (2D) or three-dimensional (3D) structure. Each memory block having a 2D structure may include memory cells which are arranged in parallel on a substrate. Each memory block having a 3D structure may include memory cells which are vertically stacked on a substrate.

The peripheral circuit 200 may perform program, read, and erase operations under the control of the control logic 300. For example, the peripheral circuit 200 may include a voltage generation circuit 210, a row decoder 220, a page buffer group 230, a column decoder 240, an input/output circuit 250, a current sensing circuit 260, and a control memory 270.

The voltage generation circuit 210 may generate various operating voltages Vop to be used for program, read, and erase operations in response to an operation signal OP_CMD output from the control logic 300. For example, the voltage generation circuit 210 may generate various voltages such as a program voltage, a verify voltage, a pass voltage, a read voltage, and an erase voltage, under the control of the control logic 300.

The row decoder 220 may supply the operating voltages Vop to local lines LL coupled to a memory block selected from among the memory blocks of the memory cell array 100 in response to a row address RADD output from the control logic 300. The local lines LL may include local word lines, local drain select lines, and/or local source select lines. In addition, the local lines LL may include various lines, such as source lines, coupled to the memory blocks.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI. The page buffers PB1 to PBI may be operated in response to page buffer control signals PBSIGNALS output from the control logic 300. For example, the page buffers PB1 to PBI may temporarily store data received through the bit lines BL1 to BLI, or may sense voltages or currents of the bit lines BL1 to BLI during a read or verify operation.

The column decoder 240 may transfer data between the input/output circuit 250 and the page buffer group 230 in response to a column address CADD output from the control logic 300. For example, the column decoder 240 may exchange data with the page buffers PB1 to PBI through data lines DL, or may exchange data with the input/output circuit 250 through column lines CL.

The input/output circuit 250 may receive a command CMD, an address ADD, and data from the memory controller 1200 through an input/output pad DQ, and may output read data to the memory controller 1200 through the input/output pad DQ. For example, the input/output circuit 250 may transmit the command CMD and the address ADD, received from the memory controller 1200 to the control logic 300, or may exchange data with the column decoder 240.

During a read or verify operation, the current sensing circuit 260 may generate a reference current in response to an enable bit VRY_BIT<#>, and may compare a sensing voltage VPB, received from the page buffer group 230, with a reference voltage generated by the reference current and output a pass signal PASS or a fail signal FAIL.

The control logic 300 may receive the command CMD and the address ADD in response to the signals received through CE #, WE #, RE #, ALE, CLE, and WP # pads. The control logic 300 may generate control signals for controlling the peripheral circuit 200 with reference to control codes CTRCODES in response to the reception of the command CMD and the address ADD, and may output the generated control signals to the peripheral circuit 200. For example, the control signals may include at least one of the operation signal OP_CMD, the row address RADD, the page buffer control signals PBSIGNALS, and the enable bit VRY_BIT<#>. The control logic 300 may output the operation signal OP_CMD to the voltage generation circuit 210, output the row address RADD to the row decoder 220, output the page buffer control signals PBSIGNALS to the page buffer group 230, and output the enable bit VRY_BIT<#> to the current sensing circuit 260. Further, the control logic 300 may determine whether a verify operation has passed or failed in response to a pass or fail signal PASS or FAIL.

The control memory 270 may store the control codes CTRCODES required by the control logic 300 to control the peripheral circuit 200. The control codes may include a code (or an algorithm) for generating control signals related to a program operation, a read operation, an erase operation, etc., and a code for generating control signals related to a plane-interleaved operation. For example, the control codes may include a code for generating a control signal related to a plane-interleaved read operation. For example, the control memory 270 may be a read only memory (ROM), a programmable ROM (PROM), an electrically programmable ROM (EPROM), an electrically erasable and programmable ROM (EEPROM), or the like. Although the control memory 270 may be construed as being included in the peripheral circuit 200 depending on the expression thereof, it may be distinguished from the peripheral circuit 200 to make a clear description or clarify a target to be designated.

Figure 4:
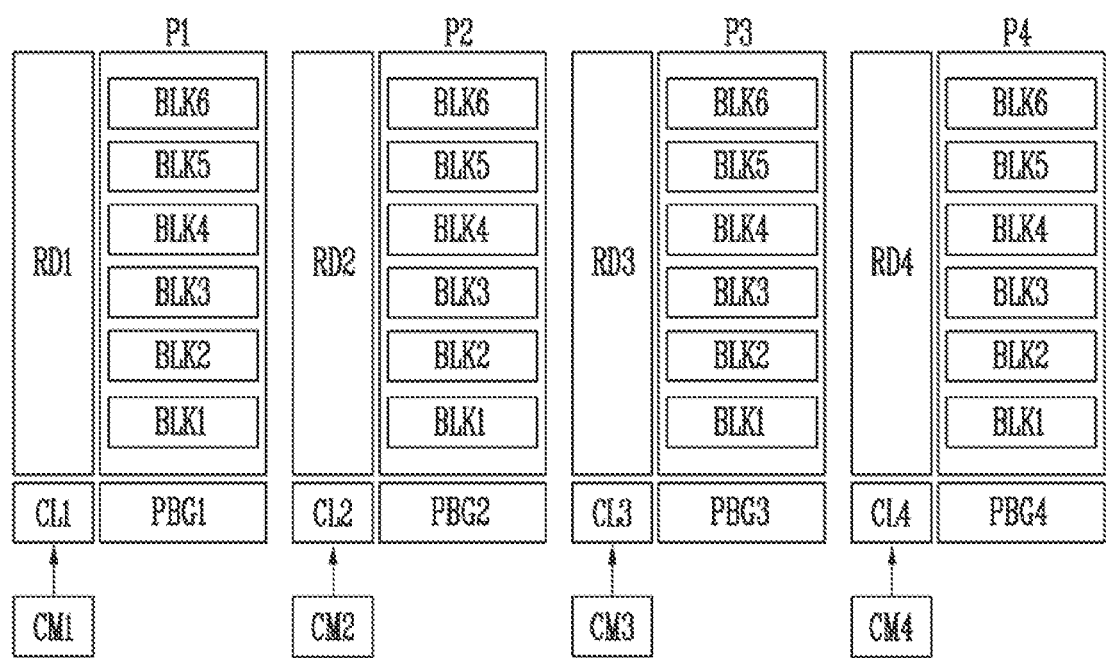
FIG. 4 is a diagram illustrating a multi-plane structure.

FIG. 4 is a diagram illustrating a multi-plane structure.

Referring to FIG. 4, a memory device 1100 having a multi-plane structure may include multiple planes P1 to P4. For example, first to fourth planes P1 to P4 may be included in one memory device 1100.

The first to fourth planes P1 to P4 may be coupled to respective row decoders RD1 to RD4 and to respective page buffer groups PBG1 to PBG4, and may be independently operated. For example, the first plane P1 may be operated while being coupled to the first row F, decoder RD1 and the first page buffer group PBG1, the second plane P2 may be operated while being coupled to the second row decoder RD2 and the second page buffer group PBG2, the third plane P3 may be operated while being coupled to the third row decoder RD3 and the third page buffer group PBG3, and the fourth plane P4 may be operated while being to coupled to the fourth row decoder RD4 and the fourth page buffer group PBG4.

When a read operation is described as an example, the first to fourth row decoders RD1 to RD4 may apply a read voltage to memory blocks respectively selected from the first to fourth planes P1 to P4, in response to received row addresses, respectively. The first to fourth page buffer groups PBG1 to PBG4 may temporarily store pieces of data read by sensing the voltages or currents of bit lines coupled to the first to fourth planes P1 to P4. When all of sensing operations performed on the first to fourth planes P1 to P4 have been completed, the pieces of read data which are temporarily stored in the first to fourth page buffer groups PBG1 to PBG4 may be sequentially output through the input/output circuit (e.g., 250 of FIG. 2). For example, after the read data in the first page buffer group PBG1 has been output first, the pieces of read data in the second to fourth page buffer groups PBG2 to PBG4 may be sequentially output.

As illustrated in FIG. 4, the memory device 1100 including the multiple planes P1 to P4 may simultaneously perform read, program or erase operations on blocks or pages disposed in different planes. For example, the memory controller 1200 may transmit a command indicating a plane-interleaved operation to the control logic 300. For example, the memory controller 1200 may transmit a command indicating a plane-interleaved read operation to the control logic 300 so that blocks or pages disposed in different planes are simultaneously read. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Meanwhile, in order to perform the plane-interleaved operations, the control logic 300 may include a plurality of independent control logic CL1 to CL4 respectively corresponding to the planes P1 to P4. For example, the first independent control logic CL1 may control an operation performed on the first plane P1, the second independent control logic CL2 may control an operation performed on the second plane PL2, the third independent control logic CL3 may control an operation performed on the third plane P3, and the fourth logic CL4 may control an operation performed on the fourth plane P4. Therefore, the first to fourth row decoders RD1 to RD4 and the first to fourth page buffers PBG1 to PBG4 may be independently controlled by the first to fourth plurality of independent control logic CL1 to CL4. The independent control logic (i.e., CL1, CL2, CL3, or CL4) may be implemented as hardware, software, or a combination of hardware and software. For example, the independent control logic (i.e., CL1, CL2, CL3, or CL4) may be an independent control logic circuit operating in accordance with an algorithm and/or a processor executing independent control logic code. P Further, when the plurality of independent control logic CL1 to CL4 use one control memory 270, a bottleneck phenomenon which interferes with independent operations between the planes P1 to P4 may occur. For example, while the first independent control logic CL1 accesses the control memory and acquires a control code, the control memory 270 is in a busy state, and thus the second independent control logic CL2 may have a limitation on access to the control memory 270 and acquisition of a control code. In order to solve this problem, the control memory 270 may include a plurality of control memories CM1 to CM4 that are independent of each other. For example, the first independent control logic CL1 may acquire a control code with reference to the first control memory CM1, the second independent control logic CL2 may acquire a control code with reference to the second control memory CM2, the third independent control logic CL3 may acquire a control code with reference to the third control memory CM3, and the fourth independent control logic CL4 may acquire a control code with reference to the fourth control memory CM4.

Hereinafter, although a description will be made on the assumption that the plurality of independent control logic CL1 to CL4 are present for respective planes P1 to P4, as illustrated in FIG. 4, the present disclosure is not necessarily limited thereto. For example, an embodiment may be implemented such that at least some of the plurality of independent control logic CL1 to CL4 are integrated into a single control logic and such that the single control logic controls two or more planes. Further, an embodiment, which will be described later, may be implemented such that control memories CM1 to CM4 are integrated into a single control memory and such that the single control memory stores control codes for controlling two or more planes.

Figure 5:
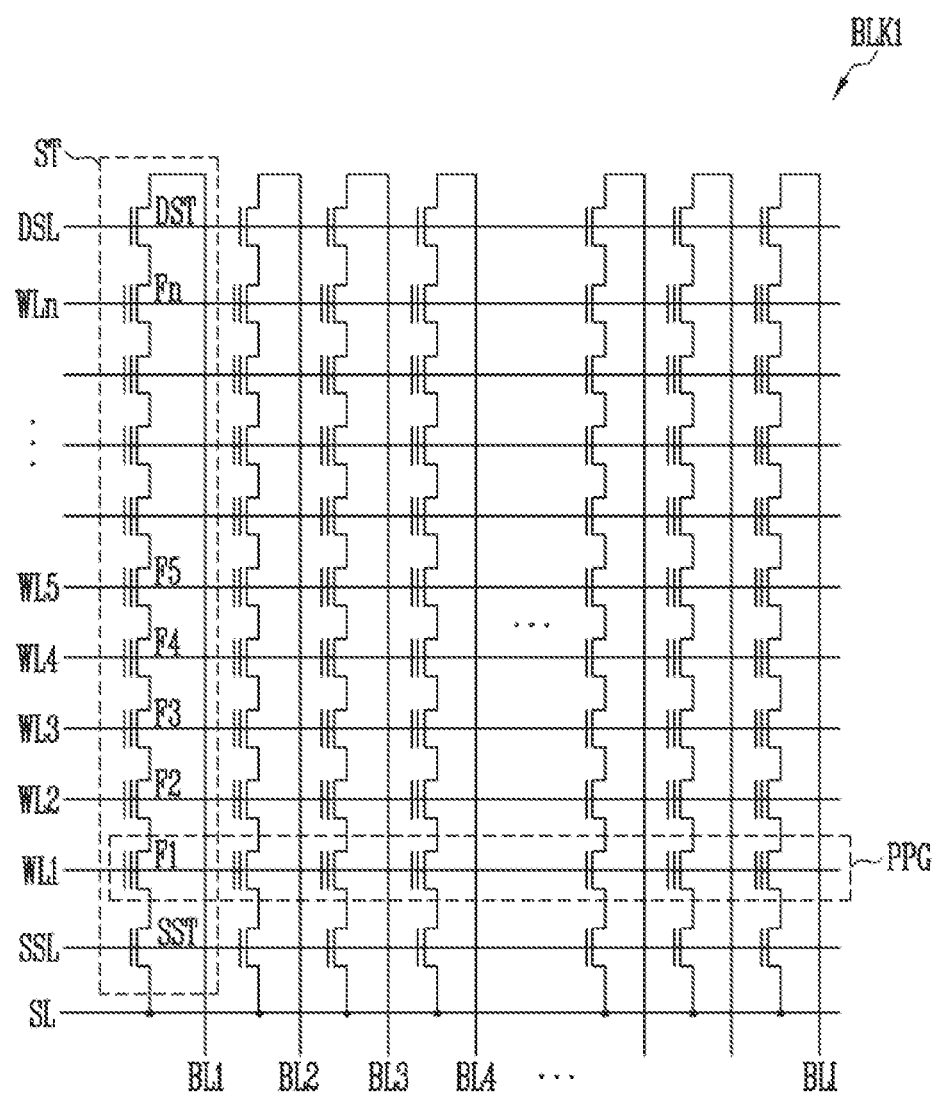
FIG. 5 is a diagram illustrating a memory block of FIG. 4.

FIG. 5 is a diagram illustrating the memory block of FIG. 4.

Referring to FIG. 5, the first memory block BLK1, among the plurality of memory blocks BLK1 to BLK6 illustrated in FIG. 4, is illustrated, for example. The remaining memory blocks BLK2 to BLK6 may have the same configuration as the first memory block BLK1.

The first memory block BLK1 may include a plurality of cell strings ST coupled between bit lines BL1 to BLI and a source line SL. For example, the cell strings ST may be respectively coupled to the bit lines BL1 to BLI, and may be coupled in common to the source line SL. Since the cell strings ST are configured in a similar form, a description will be made based on the cell string ST coupled to the first bit line BL1 by way of example.

The cell string ST may include a source select transistor SST, first to n-th memory cells F1 to Fn (where n is a positive integer), and a drain select transistor DST which are coupled in series between the source line SL and the first bit line BL1. The number of source select transistors SST and the number of drain select transistors DST are not limited to specific numbers illustrated in FIG. 5. The source select transistor SST may be coupled between the source line SL and the first memory cell F1. The first to n-th memory cells F1 to Fn may be coupled in series between the source select transistor SST and the drain select transistor DST. The drain select transistor DST may be coupled between the n-th memory cell Fn and the first bit line BL1. Although not illustrated in the drawing, dummy cells may be further coupled between the memory cells F1 to Fn or between the source select transistor SST and the drain select transistor DST.

Gates of the source select transistors SST included in different cell strings ST may be coupled to a source select line SSL, gates of the first to n-th memory cells F1 to Fn may be coupled to first to n-th word lines WL1 to WLn, and gates of the drain select transistors DST may be coupled to a drain select line DSL. Here, a group of memory cells respectively coupled to the word lines WL1 to WLn is referred to as a page (PG). For example, a group of first memory cells F1 coupled to the first word line WL1, among the memory cells F1 to Fn included in different cell strings ST, may be a single physical page (PPG). Program and read operations may be performed on a physical page (PPG) basis.

Figure 6:
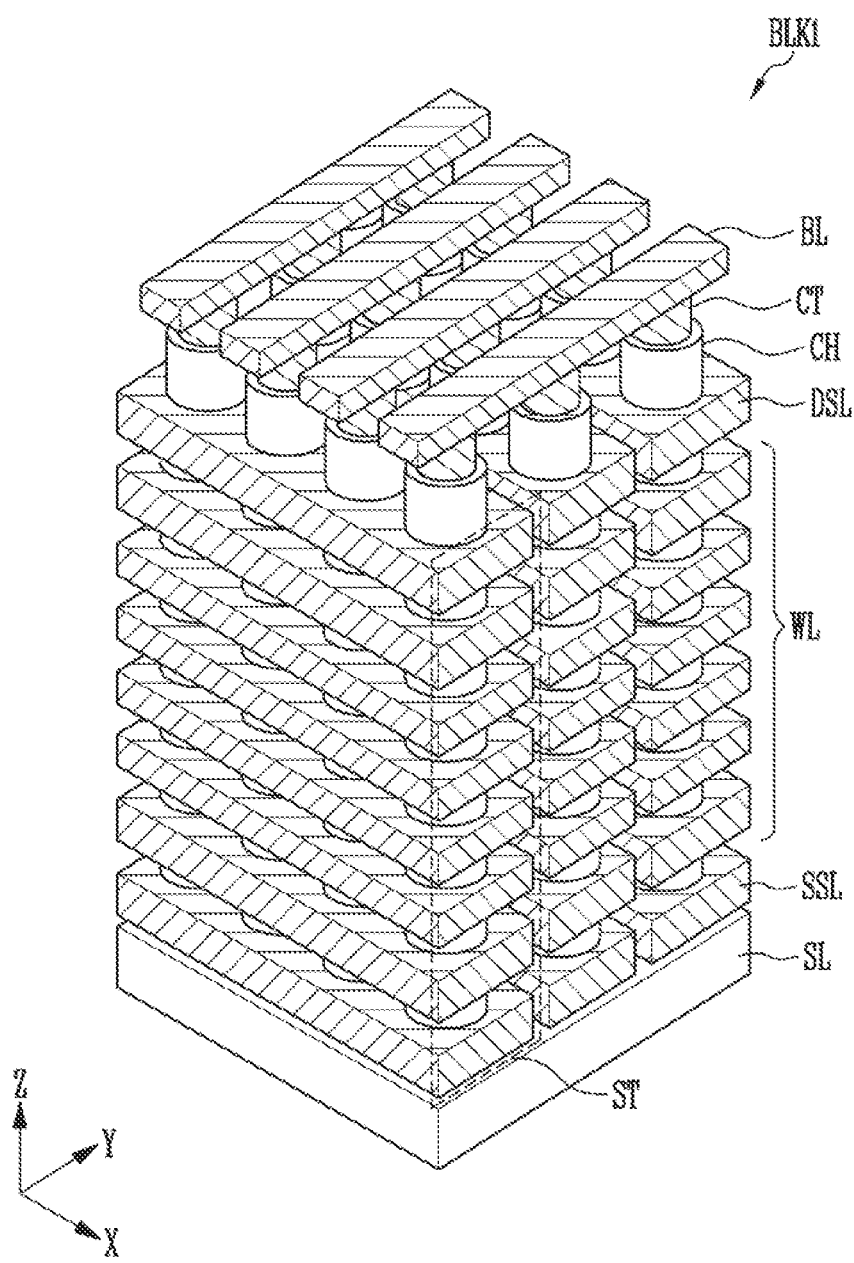
FIG. 6 is a diagram illustrating an embodiment in which the memory block of FIG. 4 is configured in a 3D structure.

FIG. 6 is a diagram illustrating an embodiment in which the memory block of FIG. 4 is configured in a 3D structure.

Referring to FIG. 6, the first memory block BLK1, among the plurality of memory blocks BLK1 to BLK6 illustrated in FIG. 4, is exemplarily illustrated. The remaining memory blocks BLK2 to BLK6 may have the same configuration as the first memory block BLK1.

The first memory block BLK1 implemented in a 3D structure may be for led in an I-shape in a vertical direction (e.g., a Z direction) on a substrate, and may include a plurality of cell strings ST arranged between bit lines BL and a source line SL. Alternatively, a well may be formed instead of the source line SL. This structure may be called "Bit Cost Scalable (BiCS)". For example, in the case where the source line SL is horizontally formed on the top of the substrate, the cell strings ST having a BiCS structure may be formed in a vertical direction (e.g., a Z direction) on the top of the source line SL.

For example, the cell strings ST may be individually arranged in a first direction (e.g., an X direction) and in a second direction (e.g., a Y direction). Each of the cell strings ST may include a source select line SSL, word lines WL, and a drain select line DSL which are stacked to be spaced apart from each other. The number of source select lines SSL, the number of word lines WL, and the number of drain select lines DSL are not limited to those shown in the drawing, and may be changed depending on the memory device. Each cell string ST may include vertical channel layers CH which vertically pass through the source select line SSL, the word lines WL, and the drain select line DSL, and bit lines BL which come into contact with the tops of the vertical channel layers CH protruding upwardly from the drain select line DSL and extend in a second direction (e.g., a Y direction). The memory cells may be formed between the word lines WL and the vertical channel layers CH. Contact plugs CT may be further formed between the bit lines BL and the vertical channel layers CH.

Figure 7:
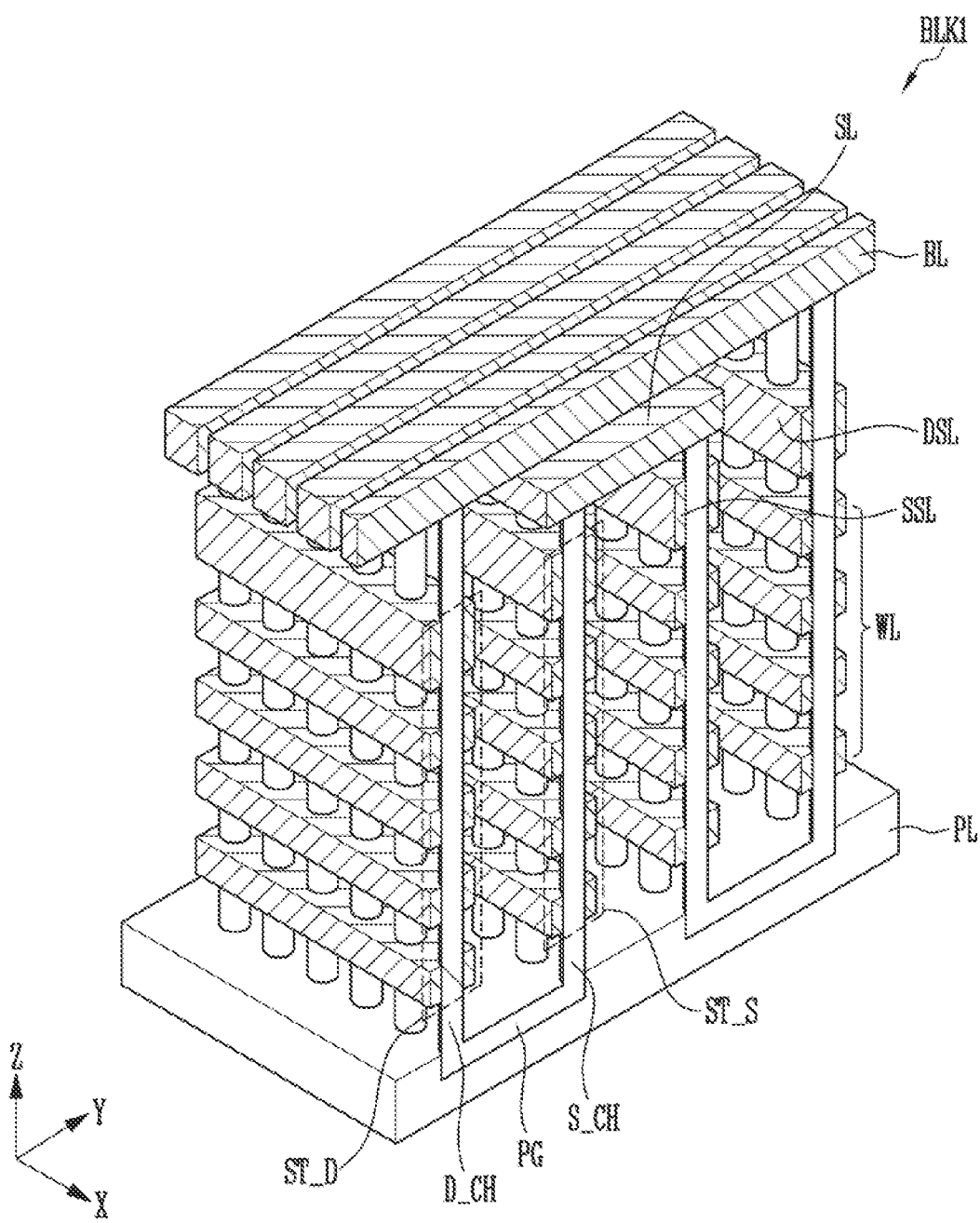
FIG. 7 is a diagram illustrating an embodiment in which the memory block of FIG. 4 is configured in a 3D structure.

FIG. 7 is a diagram illustrating an embodiment in which the memory block of FIG. 4 is configured in a 3D structure.

Referring to FIG. 7, the first memory block BLK1, among the plurality of memory blocks BLK1 to BLK6 illustrated in FIG. 4, is exemplarily illustrated. The remaining memory blocks BLK2 to BLK6 may have the same configuration as the first memory block BLK1.

The first memory block BLK1 implemented in a 3D structure may be formed in a U-shape in a vertical direction (e.g., a Z direction) on a substrate, and may include source strings ST_S and drain strings ST_D which are coupled between bit lines BL and a source line SL to form pairs. Each source string ST_S and the corresponding drain string ST_D may be coupled to each other through a pipe gate PG, thus forming a U-shape. The pipe gate PG may be formed in a pipeline PL. In greater detail, the source strings ST_S and may be vertically formed between the source line SL and the pipe line PL. The drain strings ST_D may be vertically formed between the bit lines BL and the pipeline PL. This structure may also be referred to as "Pipe-shaped Bit Cost Scalable (P-BiCS)".

For example, the drain strings ST_D and the source strings ST_S may be individually arranged in the first direction (e.g., X direction) and the second direction (e.g., Y direction), and the drain strings ST_D and the source strings ST_S may be alternately arranged along the second direction Y. Each drain string ST_D may include word lines WL and a drain select line DSL which are stacked to be spaced apart from each other, and drain vertical channel layers D_CH which vertically pass through the word lines WL and the drain select line DSL. Each source string ST_S may include word lines WL and a source select line SSL which are stacked to be spaced apart from each other, and source vertical channel layers S_CH which vertically pass through the word lines WL and the source select line SSL. The drain vertical channel layers D_CH and the source vertical channel layers S_CH may be coupled to each other through pipe gates PG in the pipeline PL. The bit lines BL may come into contact with the tops of the drain vertical channel layers D_CH protruding upwardly from the drain select line DSL, and may extend in the second direction (e.g., the Y direction).

Figure 8A:
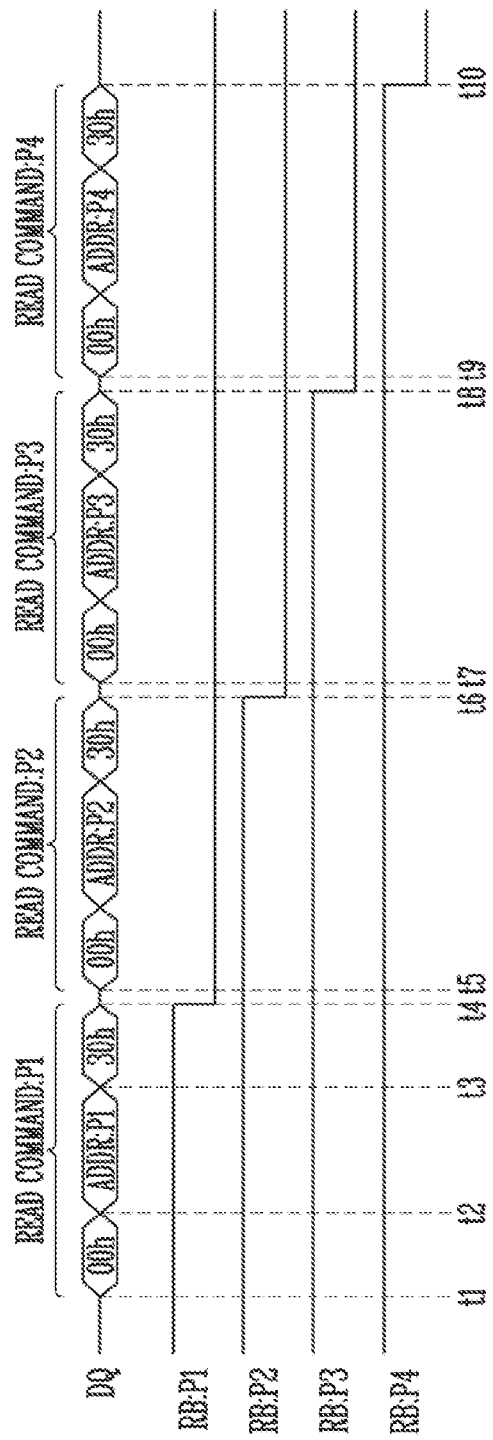

FIGS. 8A and 8B are timing diagrams illustrating a plane-interleaved read operation of a memory device having the multi-plane structure of FIG. 4.

Referring to FIGS. 8A and 8B, commands CMD and addresses ADDR:P1 to ADDR:P4, which are received through the input/output pad DQ of FIG. 2, pieces of data DATA OUT:P1 to DATA OUT: P4, which are output through the input/output pad DQ, and ready-busy signals RB:P1 to RB:P4, which are output through the RB pad of FIG. 2, are illustrated. The ready-busy signals RB:P1 to RB:P4 output through the RB pad may indicate a ready state or a busy state of each of planes P1, P2, P3, and P4 included in the memory device 1100.

At a first time t1, the memory device 1100 may receive a first page read command 00h through the input/output pad DQ. At a second time t2, the memory device 1100 may receive an address ADDR:P1 corresponding to a page of the first plane P1, which is a read target, through the input/output pad DQ. At a third time t3, the memory device 1100 may receive a second page read command 30h through the input/output pad DQ. The first page read command 00h, the address ADDR:P1 corresponding to the page of the first plane P1, and the second page read command 30h may constitute a read command for the first plane P1. As the read command for the first plane P1 is received, a read operation on the first plane P1 may be started. Accordingly, at a fourth time t4, the ready-busy signal RB:P1 for the first plane P1 may make a transition from a high value indicating a ready state to a loan value indicating a busy state.

During a period from a fifth time t5 to a sixth time t6, the memory device 1100 may receive a first page read command 00h, an address ADDR:P2 corresponding to a page of the second plane P2, and a second page read command 30h through the input/output pad DQ. The first page read command 00h, the address ADDR:P2 corresponding to the page of the second plane P2, and the second page read command 30h may constitute a read command for the second plane P2. As the read command for the second plane P2 is received, a read operation on the second plane P2 may be started. Accordingly, at the sixth time t6, the ready-busy signal RB:P2 for the second plane P2 may make a transition from a high value indicating a ready state to a low value indicating a busy state.

During a period from a seventh time t7 to an eighth time t8, the memory device 1100 may receive a first page read command 00h, an address ADDR:P3 corresponding to a page of the third plane P3, and a second page read command 30h through the input/output pad DQ. The first page read command 00h, the address ADDR:P3 corresponding to the page of the third plane P3, and the second page read command 30h may constitute a read command for the third plane P3. As the read command for the third plane P3 is received, a read operation on the third plane P3 may be started. Accordingly, at the eighth time t8, the ready-busy signal RB:P3 for the third plane P3 may make a transition from a high value indicating a ready state to a low value indicating a busy state.

During a period from a ninth time t9 to a tenth time t10, the memory device 1100 may receive a first page read command 00h, an address ADDR:P4 corresponding to a page of the fourth plane P4, and a second page read command 30h through the input/output pad DQ. The first page read command 00h, the address ADDR:P4 corresponding to the page of the fourth plane P4, and the second page read command 30h may constitute a read command for the fourth plane P4. As the read command for the fourth plane P4 is received, a read operation on the fourth plane P4 may be started. Accordingly, at the tenth time t10, the ready-busy signal RB:P4 for the fourth plane P4 may make a transition from a high value indicating a ready state to a low value indicating a busy state.

Referring to FIG. 8B, at an eleventh time t11, the read operation on the first plane P1 may be completed. Accordingly, at the eleventh time t11, the ready-busy signal RB:P1 for the first plane P1 may make a transition from a low value to a high value. During a period from the eleventh time t11 to a twelfth time t12, the memory device 1100 may output read data DATA OUT:P1 for the first plane P1 through the input/output pad DQ.

At a thirteenth time t13, the read operation on the second plane P2 may be completed. Accordingly, at the thirteenth time t13, the ready-busy signal RB:P2 for the second plane P2 may make a transition from a low value to a high value. During a period from the thirteenth time t13 to a fourteenth time t14, the memory device 1100 may output read data DATA OUT:P2 for the second plane P2 through the input/output pad DQ.

At a fifteenth time t15, the read operation on the third plane P3 may be completed. Accordingly, at the fifteenth time t15, the ready-busy signal RB:P3 for the third plane P3 may make a transition from a low value to a high value. During a period from the fifteenth time t15 to a sixteenth time t16, the memory device 1100 may output read data DATA OUT:P3 for the third plane P3 through the input/output pad DQ.

At a seventeenth time t17, the read operation on the fourth plane P4 may be completed. Accordingly, at the seventeenth time t17, the ready-busy signal RB:P4 for the fourth plane P4 may make a transition from a low value to a high value. The memory device 1100 may output read data DATA OUT:P4 for the fourth plane P4 through the input/output pad DQ from the seventeenth time t17.

As illustrated in FIGS. 8A and 8B, the memory device 1100 having a multi-plane structure may start a read operation on any one plane, and may then receive a read command for an additional plane and start a read operation on the additional plane before the read operation on the one plane is terminated.

As described above, an operation in which read operations on respective planes are performed in parallel or are performed to overlap each other during at least some time periods may be designated as a plane-interleaved read operation. Since the plane-interleaved read operation is performed such that read operations on multiple planes are performed to overlap each other, the operational speed of the memory device may be improved, FIG. 9 is a diagram illustrating threshold voltage distributions of memory cells in the form of triple-level cells.

Figure 9:
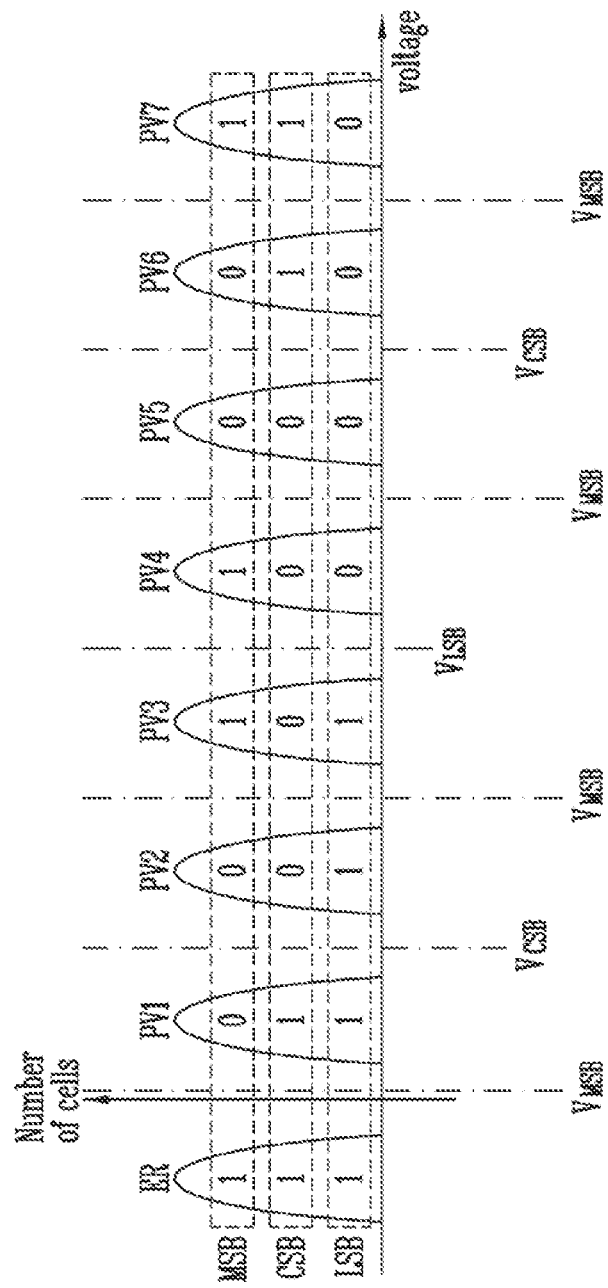
FIG. 9 is a diagram illustrating threshold voltage distributions of memory cells in the form of triple-level cells.

Referring to FIG. 9, the number of threshold voltage distributions of memory cells in a memory device 1100 to which a multi-level cell (MLC) is applied may be four or more, That is, a data storage method for dividing the states of memory cells into at least four threshold voltage distributions is generally referred to as a multi-level cell (MLC) method. For example, the memory cells may have different types of data depending on an erased state, a first program state, a second program state or a third program state. A data storage method for dividing the states of memory cells into eight threshold voltage distributions is referred to as a triple-level cell (TLC) method, and a data storage method for dividing the states of memory cells into 16 threshold voltage distributions is referred to as a quadruple-level cell (QLC) method. The present embodiment may be applied to the multi-level cell (MLC) method, the triple-level cell (TLC) method, and the quadruple-level cell (QLC) method, and may also be applied to methods for dividing the states of memory cells into more than 16 threshold voltage distributions.

Referring to FIG. 9, threshold voltage distributions of triple-level cells (TLC) are illustrated, for example.

In the triple-level cells (TLC), memory cells may have eight threshold voltage distributions. For example, the states of memory cells may be divided into an erased state ER and first to seventh program states PV1 to PV7 depending on threshold voltage distributions. Gray codes may be assigned to the memory cells depending on respective threshold voltage distributions, and the memory cells may be programmed and read based on the gray codes. In the triple-level cells (TLC), one memory cell may be divided into three gray codes. In the triple-level cells (TLC), each gray code may include a least significant bit (LSB), a center significant bit (CSB), and a most significant bit (MSB), and the states of the memory cells may be divided into eight states depending on the combination of the gray codes.

For example, a gray code for the erased state ER may be set to '111', a gray code for the first program state PV1 may be set to '110', and a gray code for the seventh program state PV7 may be set to '011'. The combination of gray codes may differ depending on the memory device 1100, and thus a read voltage used in a read operation may also vary with the gray codes. The gray codes illustrated in FIG. 9 are described below by way of example. That is, in an LSB read operation, one LSB read voltage VLSB may be used, in a CSB read operation, two CSB read voltages VCSB may be used, and in an MSB read operation, four MSB read voltages VMSB may be used.

Therefore, respective read operations on the LSB, the CSB, and the MSB may be distinguished from each other. Hereinafter, an operation of reading a least significant bit (LSB) from a specific page is designated as an LSB page read operation, an operation of reading a center significant bit (CSB) from the specific page is designated as a CSB page read operation, and an operation of reading a most significant bit (MSB) from the specific page is designated as an MSB page read operation.

Figure 10:
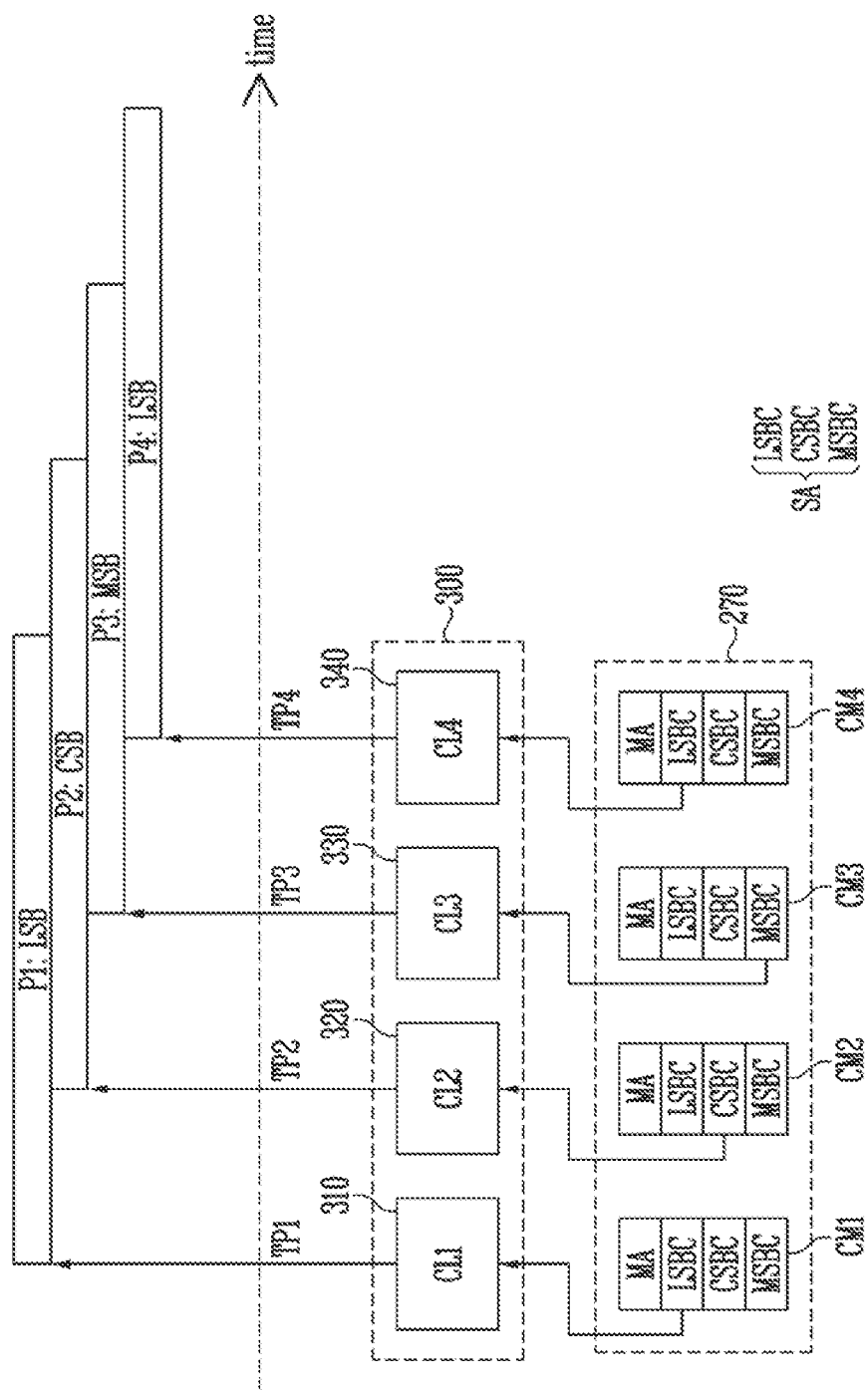
FIG. 10 is a conceptual diagram illustrating a method of utilizing control memories depending on a plane-interleaved read operation in a memory device having the multi-plane structure of FIG. 4.

FIG. 10 is a conceptual diagram illustrating a method of utilizing control memories depending on a plane-interleaved read operation in a memory device having the multi-plane structure of FIG. 4.

Referring to FIG. 10, each of first to fourth control memories CM1 to CM4 may include a main area MA which stores codes for the overall operation, such as a program operation, a read operation, and an erase operation, and a sub-area SA which stores codes for performing a plane-interleaved operation. For example, the sub-area SA may include an LSB code LSBC for performing an LSB page read operation, a CSB code CSBC for performing a CSB page read operation, and an MSB code MSBC for performing an MSB page read operation.

Although each of first to fourth control memories CM1 to CM4 is illustrated as including a main area MA and a sub-area SA in FIG. 10, the main areas MA of the first to fourth control memories CM1 to CM4 may be configured as a single main memory, and the sub-areas SA thereof may be configured as respective auxiliary memories. In this case, the main areas MA used to configure the main memory may additionally store a code for performing a plane-interleaved operation and then replace one auxiliary memory. Also, at least one of the main memory and auxiliary memories may be composed of a memory (or area) which stores control codes for controlling page buffer groups PBG1 to PBG4, illustrated in FIG. 4, and a memory which stores the remaining control codes so that the plurality of independent control logic CL1 to CL4 are capable of independently accessing control codes for respectively controlling the page buffer groups PBG1 to PBG4, separately from other control codes. In an embodiment, referring to FIGS. 10, 11, and 12, the control logic 300 may include independent control logic CL1 310, independent control logic CL2 320, independent control logic CL3 330, and independent control logic CL4 340.

Meanwhile, the memory controller 1200 may transmit a read a command indicating a plane-interleaved read operation to the plurality of independent control logic CL1 to CL4 of the memory device 1100. For example, the read command may be one of an LSB read command indicating an LSB page read operation on a plane selected from among multiple planes, a CSB read command indicating a CSB page read operation on the selected plane, and an MSB read command indicating an MSB page read operation on the selected plane.

Hereinafter, the case will be described where, for the plane-interleaved read operation, the memory controller 1200 transmits an LSB read command for a first plane P1 to the first independent control logic CL1, transmits a CSB read command for a second plane P2 to the second independent control logic CL2, transmits an MSB read command for a third plane P3 to the third independent control logic CL3, and transmits an LSB read command for a fourth plane P4 to the fourth independent control logic CL4. However, the present disclosure is not necessarily limited thereto, and a read command to be transmitted and a control logic to which the corresponding read command is to be transmitted may be determined based on a request received by the memory controller 1200 from a host 2000.

First, the first independent control logic CL1 may acquire an LSB code LSBC from the first control memory CM1 in response to the LSB read command, and may perform the LSB page read operation on the first plane P1 with reference to the acquired LSB code LSBC at a first time TP1.

The second independent control logic CL2 may acquire a CSB code CSBC from the second control memory CM2 in response to the CSB read command, and may perform the CSB page read operation on the second plane P2 with reference to the acquired CSB code CSBC at a second time TP2.

The third independent control logic CL3 may acquire an MSB code MSBC from the third control memory CM3 in response to the MSB read command, and may perform the MSB page read operation on the third plane P3 with reference to the acquired MSB code MSBC at a third time TP3.

The fourth independent control logic CL4 may acquire an LSB code LSBC from the fourth control memory CM4 in response to the LSB read command, and may perform the LSB page read operation on the fourth plane P4 with reference to the acquired LSB code LSBC at a fourth time TP4.

As described above, when respective plurality of independent control logic CL1 to CL4 use independent control memories, the plurality of independent control logic CL1 to CL4 do not simultaneously access the control memories, and thus there is an advantage in that read operations may be performed in parallel on respective planes.

However, since respective control memories CM1 to CM4 may separately store the LSB code LSBC, the CSB code CSBC, and the MSB code MSBC, and the corresponding control logic uses only one of the codes, the inefficiency of storage space may be caused. In particular, when the storage space occupied by the control memories CM1 to CM4 is increased, the size of the peripheral circuit 200 is increased, and thus the area occupied by the memory cell array 100 in the memory device 1100 may be reduced.

Therefore, a plane-interleaved operation that may minimize and use storage space while maximally guaranteeing parallel operations of the plurality of independent control logic will be described below.

Figure 11:
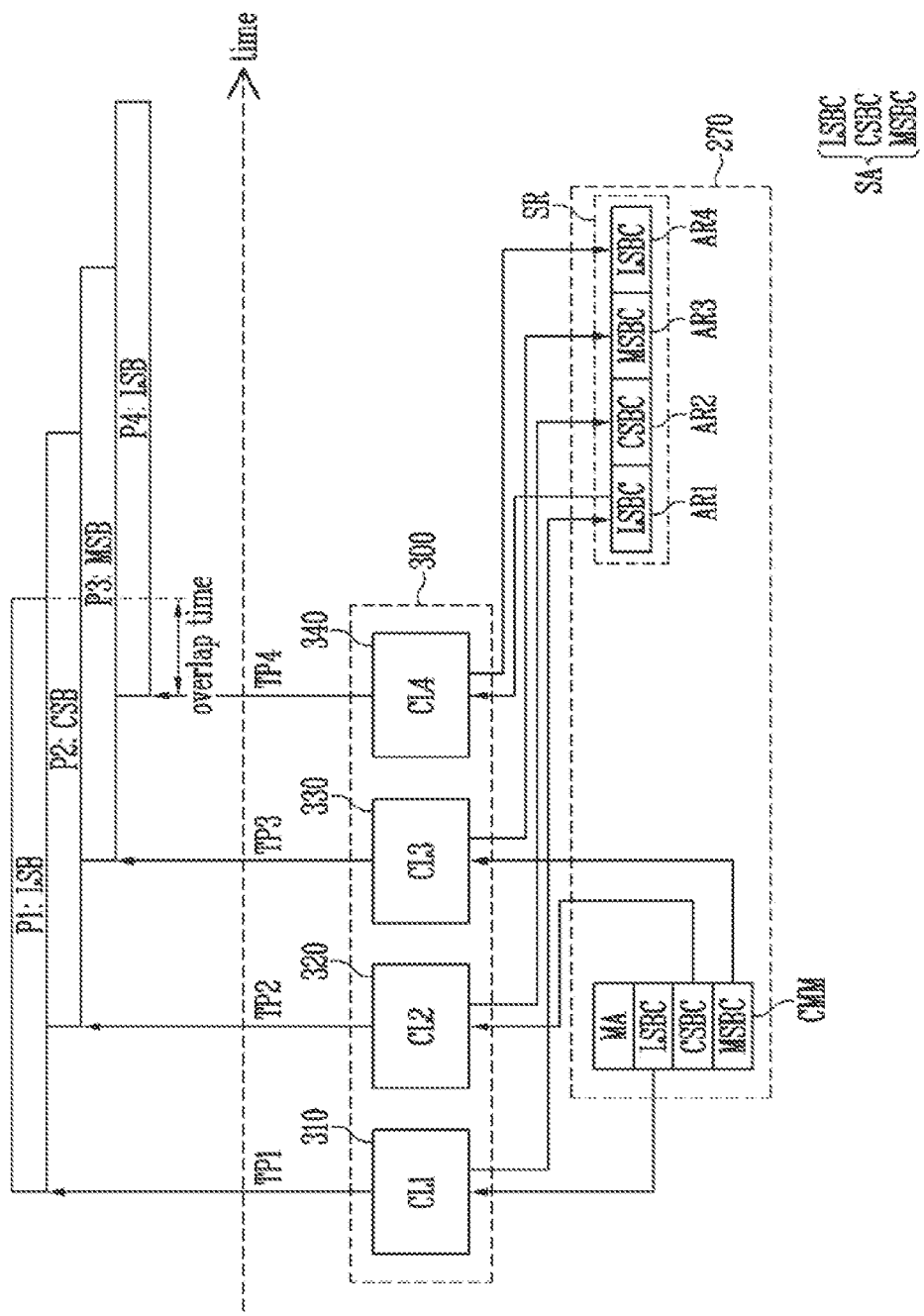
FIG. 11 is a conceptual diagram illustrating a method of configuring control memories in a form different from that of the control memories of FIG. 10 and performing a plane-interleaved read operation.

FIG. 11 is a conceptual diagram illustrating a method of configuring control memories in a form apart from that of the control memories of FIG. 10 and performing a plane-interleaved read operation.

Referring to FIG. 11, for the plane-interleaved read operation, the case will be described where, similarly to FIG. 10, the memory controller 1200 transmits a LSB read command for a first plane P1 to the first independent control logic CL1, transmits a CSB read command for a second plane P2 to the second independent control logic CL2, transmits an MSB read command for a third plane P3 to the third independent control logic CL3, and transmits an LSB read command for a fourth plane P4 to the fourth independent control logic CL4.

However, apart from the configuration of FIG. 10, the control memory 270 may include a common memory CMM, which is accessible by all of the plurality of independent control logic CL1 to CL4, and a temporary storage SR. For example, the common memory CMM may be a read only memory (ROM), a programmable ROM (PROM), an electrically programmable ROM (EPROM), an electrically erasable and programmable ROM (EEPROM), or the like.

Similar to the first to fourth control memories CM1 to CM4 described above with reference to FIG. 10, the common memory CMM may include a main area MA which stores codes for the overall operation including a program operation, a read operation, and an erase operation, and a sub-area SA which stores codes for performing a plane-interleaved operation.

The temporary storage SR may include areas which correspond to respective planes P1 to P4 and are physically independent of each other so that the plurality of independent control logic CL1 to CL4 may simultaneously access the temporary storage SR. For example, when there are first to fourth planes P1 to P4, as illustrated in the example of FIG. 4, the temporary storage SR may include first to fourth areas AR1 to AR4. The areas AR1 to AR4 may be respective shift registers that are physically identified. For example, each of the areas AR1 to AR4 may be a shift register configured such that, when new data is input, previously stored data is deleted. The plurality of independent control logic CL1 to CL4 may separately (or independently) access respective areas AR1 to AR4 so as to acquire control codes.

First, the first independent control logic CL1 may determine whether an LSB code LSBC corresponding to the received LSB read command is stored in the temporary storage SR in response to the LSB read command. When it is determined that the corresponding LSB code LSBC is not stored in the temporary storage SR, the first independent control logic CL1 may acquire the LSB code LSBC from the common memory CMM and store the acquired LSB code LSBC in the first area AR1 of the temporary storage SR. Next, the first independent control logic CL1 may perform an LSB page read operation on the first plane P1 at a first time TP1 with reference to the LSB code LSBC stored in the common memory CMM.

The second independent control logic CL2 may determine whether a CSB code CSBC corresponding to the received CSB read command is stored in the temporary storage SR in response to the CSB read command. When it is determined that the corresponding CSB code CSBC is not stored in the temporary storage SR, the second independent control logic CL2 may acquire the CSB code CSBC from the common memory CMM and store the acquired CSB code CSBC in the second area AR2 of the temporary storage SR. Next, the second independent control logic CL2 may perform a CSB page read operation on the second plane P2 from a second time TP2 with reference to the CSB code CSBC stored in the common memory CMM.

The third independent control logic CL3 may determine whether an MSB code MSBC corresponding to the received MSB read command is stored in the temporary storage SR in response to the MSB read command. When it is determined that the corresponding MSB code MSBC is not stored in the temporary storage SR, the third independent control logic CL3 may acquire the MSB code MSBC from the common memory CMM and store the acquired MSB code MSBC in the third area AR3 of the temporary storage SR. Thereafter, the third independent control logic CL3 may perform an MSB page read operation on the third plane P3 from a third time TP3 with reference to the MSB code MSBC stored in the common memory CMM.

Meanwhile, the fourth independent control logic CL4 may determine whether an LSB code LSBC corresponding to the received LSB read command is stored in the temporary storage SR in response to the LSB read command. Because the LSB code LSBC is already stored in the first area AR1 of the temporary storage SR by the first independent control logic CL1, the fourth independent control logic CL4 may determine that the LSB code LSBC is stored in the temporary storage SR. The fourth independent control logic CL4 may access the temporary storage SR, acquire the LSB code LSBC from the first area AR1 of the temporary storage SR, and store the acquired LSB code LSBC in the fourth area AR4 of the temporary storage SR. Thereafter, the fourth independent control logic CL4 may perform the LSB page read operation on the fourth plane P4 from a fourth time TP4 with reference to the LSB code LSBC.

Therefore, even in the configuration of the control memory 270 such as that illustrated in FIG. 11, page read operations corresponding to the read commands may be simultaneously performed on multiple planes (e.g., the first plane P1 to the fourth plane P4) during overlap times, similarly to FIG. 10.

Figure 12:
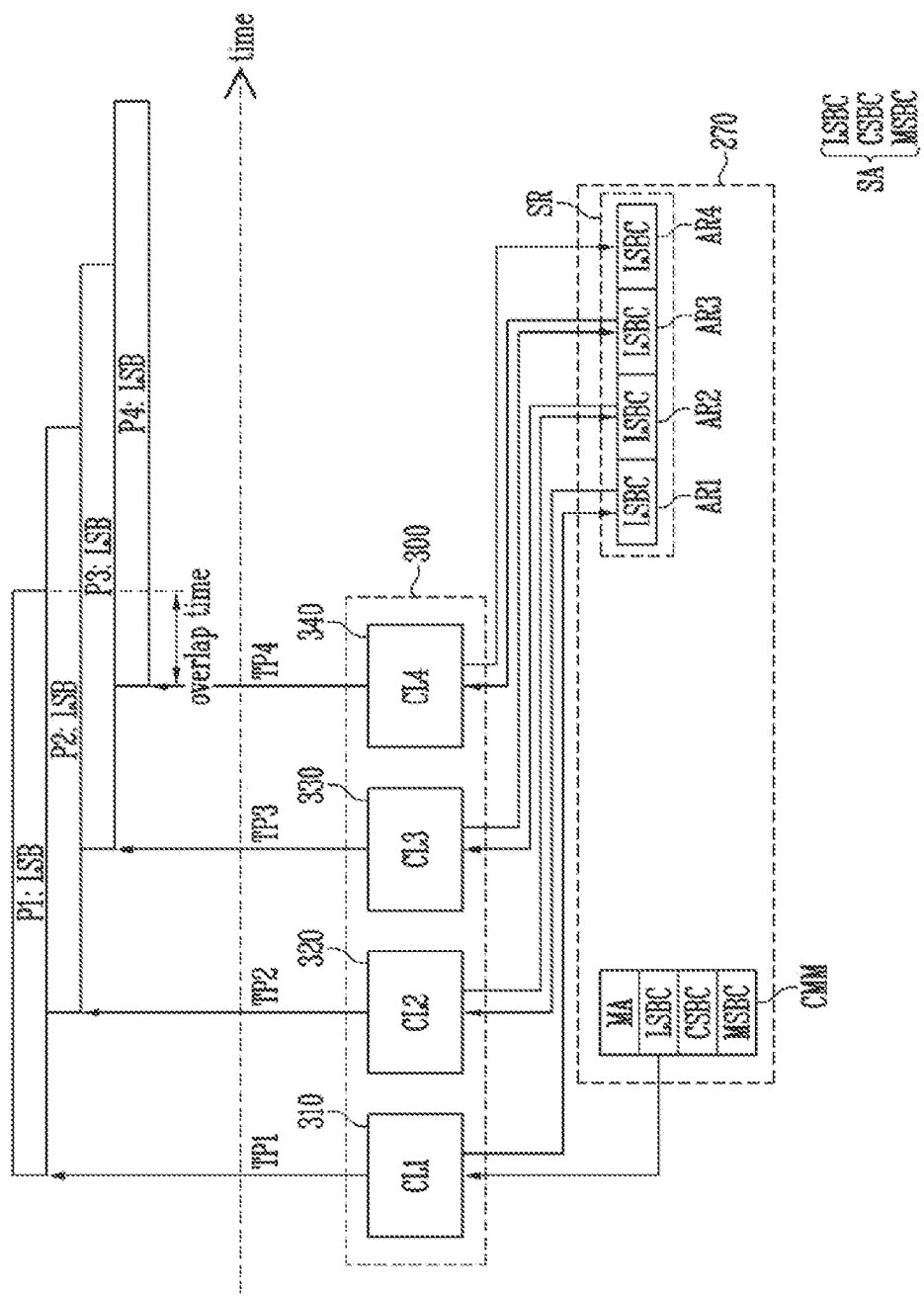
FIG. 12 is a conceptual diagram illustrating a method of performing a plane-interleaved read operation when an additional command is received in the control memory configuration of FIG. 11.

FIG. 12 is a conceptual diagram illustrating a method of performing a plane interleaved read operation when an additional command is received in the control memory configuration of FIG. 11.

Referring to FIG. 12, control memories may have the same configuration as the control memories of FIG. 11. However, apart from the configuration of FIG. 11, FIG. 12 explains the case where, in order to perform the plane-interleaved read operation, the memory controller 1200 transmits an LSB read command for a first plane P1 to the first independent control logic CL1, transmits an LSB read command for the second plane P2 to the second independent control logic CL2, transmits an LSB read command for the third plane P3 to the third independent control logic CL3, and transmits an LSB read command for the fourth plane P4 to the fourth independent control logic CL4.

First, the first independent control logic CL1 may determine whether an LSB code LSBC corresponding to the received LSB read command is stored in the temporary storage SR in response to the LSB read command. When it is determined that the corresponding LSB code LSBC is not stored in the temporary storage SR, the first independent control logic CL1 may acquire the LSB code LSBC from the common memory CMM and store the acquired LSB code LSBC in the first area AR1 of the temporary storage SR. Next, the first independent control logic CL1 may perform an LSB page read operation on the first plane P1 at a first time TP1 with reference to the LSB code LSBC stored in the common memory CMM.

The second independent control logic CL2 may determine whether an LSB code LSBC corresponding to the received LSB read command is stored in the temporary storage SR in response to the LSB read command. Because the LSB code LSBC is already stored in the first area AR1 of the temporary storage SR by the first independent control logic CL1, the second independent control logic CL2 may determine that the LSB code LSBC is stored in the temporary storage SR. In this case, the second independent control logic CL2 may access the temporary storage SR, acquire the LSB code LSBC from the first area AR1 of the temporary storage SR, and store the acquired LSB code LSBC in the second area AR2 of the temporary storage SR. Next, the second independent control logic CL2 may perform an LSB page read operation on the second plane P2 from a second time TP2 with reference to the LSB code LSBC stored in the first area AR1.

The third independent control logic CL3 may determine whether an LSB code LSBC corresponding to the received LSB read command is stored in the temporary storage SR in response to the LSB read command. Because the LSB code LSBC is already stored in the second area AR2 of the temporary storage SR by the second independent control logic CL2, the third independent control logic CL3 may determine that the LSB code LSBC is stored in the temporary storage SR. At this time, since the second independent control logic CL2 accesses the first area AR1 of the temporary storage SR and currently performs the LSB page read operation, the third independent control logic CL3 cannot access the first area AR1. In this case, the third independent control logic CL3 may acquire the LSB code LSBC from the second area AR2 of the temporary storage SR and store the acquired LSB code LSBC in the third area AR3 of the temporary storage SR. Next, the third independent control logic CL3 may perform an LSB page read operation on the third plane P3 from a third time TP3 with reference to the LSB code LSBC stored in the second area AR2.

The fourth independent control logic CL4 may determine whether an LSB code LSBC corresponding to the received LSB read command is stored in the temporary storage SR in response to the LSB read command. Because the LSB code LSBC is already stored in the third area AR3 of the temporary storage SR by the third independent control logic CL3, the fourth independent control logic CL4 may determine that the LSB code LSBC is stored in the temporary storage SR. At this time, because the second independent control logic CL2 accesses the first area AR1 of the temporary storage SR and currently performs the LSB page read operation and the third independent control logic CL3 accesses the second area AR2 of the temporary storage SR and currently performs the LSB page read operation, the fourth independent control logic CL4 cannot access the first area AR1 and the second area AR2. In this case, the fourth independent control logic CL4 may acquire the LSB code LSBC from the third area AR3 of the temporary storage SR and store the acquired LSB code LSBC in the fourth area AR4 of the temporary storage SR. Thereafter, the fourth independent control logic CL4 may perform an LSB page read operation on the fourth plane P4 at a fourth time TP4 with reference to the LSB code LSBC stored in the third area AR3.

When descriptions of FIGS. 11 and 12 are integrated, the plurality of independent control logic CL1 to CL4 may acquire a control code (one of an LSB code, a CSB code, and an MSB code) corresponding to a read command, received from the memory controller, from the common memory CMM when a control code corresponding to the received read command is not present in the temporary storage SR. Also, when the control code corresponding to the read command is stored in the temporary storage SR, the plurality of independent control logic may acquire the control code from the temporary storage SR. Here, the control code acquired from the common memory CMM or the temporary storage SR may be stored in one of the areas AR1 to AR4 of the temporary storage SR so that an additional control logic is capable of referring to the acquired control code. Thereafter, when the same read command is received by the additional control logic, an operation to be performed on any one of the planes may be controlled with reference to the control code stored in the temporary storage SR.

Therefore, even if a plurality of independent control logic perform read operations simultaneously (or in an interleaved manner) at regular time intervals, the additional control logic which performs the same read operation may acquire the control code stored in the temporary storage SR by the control logic that has first started and performed the read operation, and thus the use of storage space may be minimized while the plane-interleaved read operation may be smoothly performed.

Figure 13:
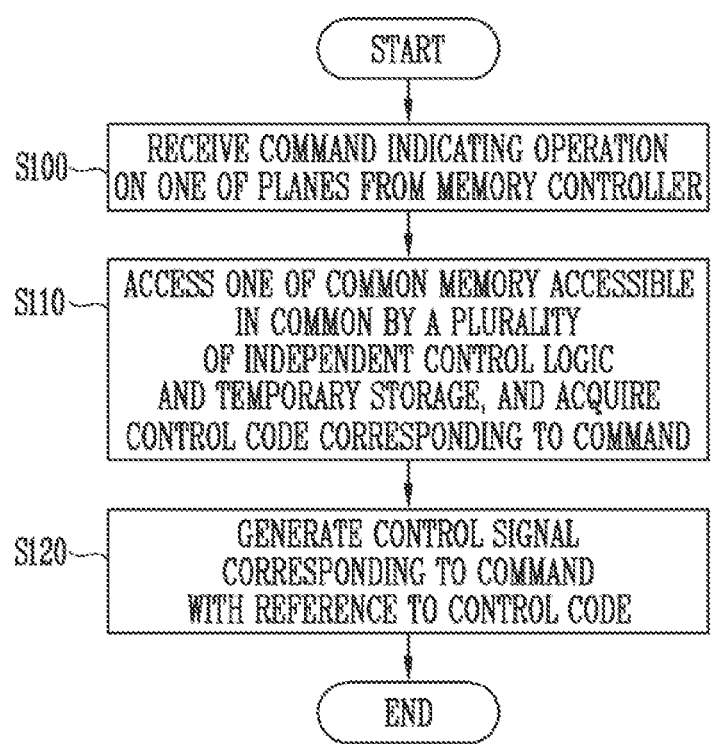
FIG. 13 is an example flowchart illustrating a method of operating a memory device having the control memory configuration of FIGS. 10 and 11.
Figure 14:
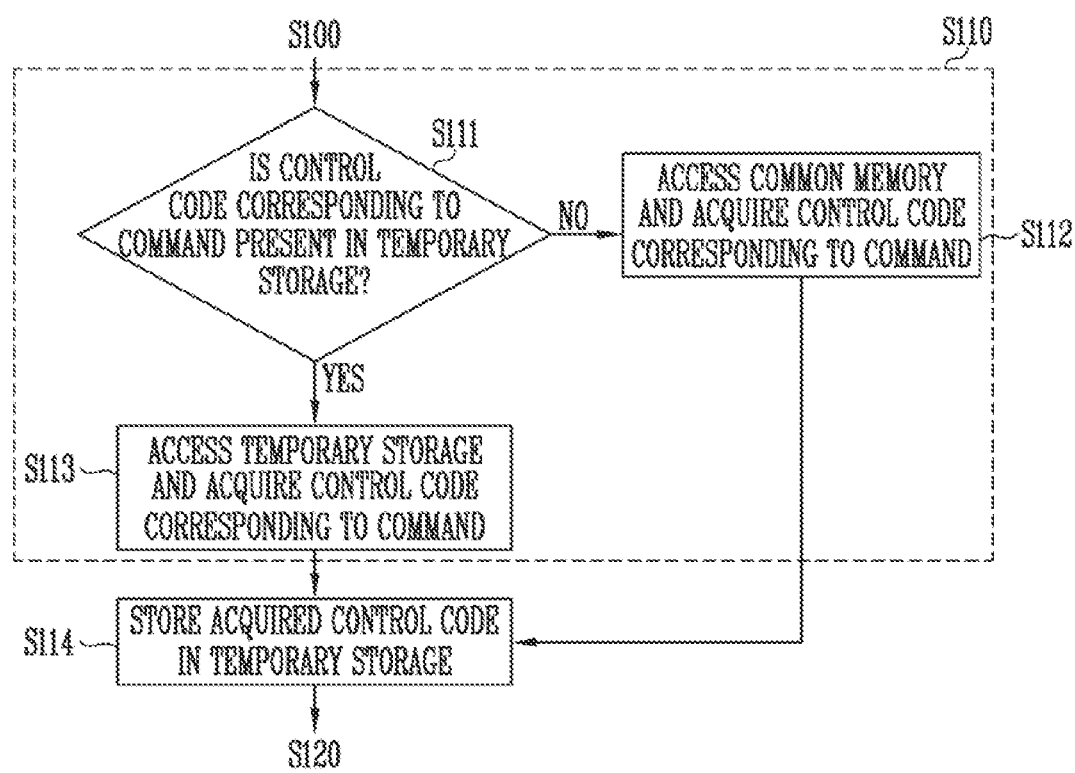
FIG. 14 is an example flowchart illustrating a part of step S110 of FIG. 13.

FIG. 13 is an example of a flowchart illustrating a method of operating a memory device having the control memory configuration of FIGS. 10 and 11. FIG. 14 is an example of a flowchart illustrating a part of step S110 of FIG. 13.

Referring to FIG. 13, a method of performing a memory device including multiple planes may include the step S100 of receiving a command indicating an operation on one of the planes from a memory controller; the step S110 of accessing one of a common memory, which is accessible in common by independent control logic, and a temporary storage and acquiring a control code corresponding to the command therefrom; and the step S120 of generating a control signal corresponding to the command with reference to the control code.

Referring to FIG. 14, the step S110 of acquiring the control code may include the step S111 of determining whether the control code corresponding to the command is present in the temporary storage, and the step S112 of, when it is determined that the control code is not present in the temporary storage, accessing the common memory and acquiring the control code from the common memory. In an embodiment, the common memory may be accessible by all of the plurality of independent control logic CL1 to CL4. That is, the common memory may be accessed in common by the independent control logics to acquire the control code.

The step S110 of acquiring the control code may include the step S111 of determining whether the control code corresponding to the command is present in the temporary storage, and the step S113 of, when it is determined that the control code is present in the temporary storage, accessing the temporary storage and acquiring the control code from the temporary storage.

The method may further include, after the step S110 of acquiring the control code, the step S114 of storing the acquired control code in the temporary storage.

The temporary storage may include areas corresponding to respective planes.

Each of the areas may be a shift register.

The step S114 storing the control code in the temporary storage may include the step of storing the control code in an area other than the area from which the control code has been acquired, among the areas.

The command may include at least one of an LSB read command, a CSB read command, and an MSB read command.

The control code may include at least one of a control code for performing an LSB page read operation corresponding to the LSB read command, a control code for performing a CSB page read operation corresponding to the CSB read command, and a control code for performing an MSB page read operation corresponding to the MSB read command.

The method may further include the step of, before an operation on a first plane, among the planes, is terminated, performing an operation corresponding to the command on a second plane, among the planes, with reference to a control code stored in a first area, among the areas.

The control code stored in the first area may be a control code for performing the same operation as that performed on the second plane on the first plane.

The control code stored in the first area may be stored in the second area, among the areas.

In addition to the above-described processes, it should be construed that the configuration of the memory device and the operating method thereof, described above with reference to FIGS. 1 to 12, are applicable to the method of operating the memory device.

Figure 15:
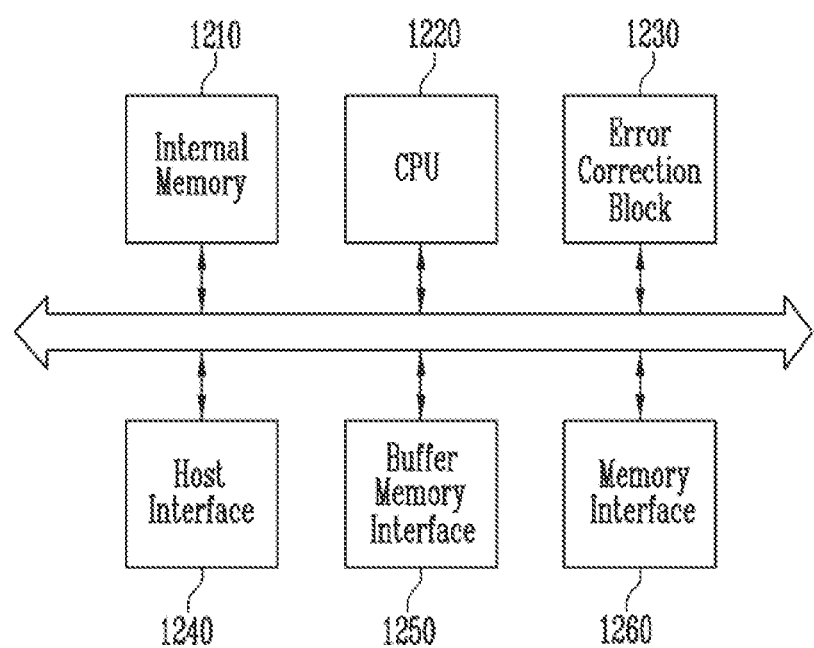
FIG. 15 is a diagram illustrating a memory controller of FIG. 1.

FIG. 15 is a diagram illustrating the memory controller of FIG. 1.

Referring to FIG. 15, the memory controller 1200 may include an internal memory 1210, a central processing unit (CPU) 1220, an error correction block 1230, a host interface 1240, a buffer memory interface 1250, and a memory interface 1260.

The internal memory 1210 may store various types of information required for the operation of the memory controller 1200. For example, the internal memory 1210 may include logical-to-physical address map tables. The internal memory 1210 may be configured using one or more of a random access memory (RAM), a dynamic RAM (DRAM), a static RAM (SRAM), a cache, and a tightly coupled memory (TCM).

The central processing unit 1220 may perform various operations for controlling the memory device 1100, or may generate various commands. When a request is received from a host (e.g., 2000 of FIG. 1), the central processing unit 1220 may generate a command in response to the received request, and may transmit the generated command to the memory device 1100.

The error correction block 1230 may detect and correct an error in data received from the memory device 1100 using an error correction code (ECC). The central processing unit 1220 may adjust a read voltage based on the result of error detection by the error correction block 1230, and may control the memory device 1100 to perform re-reading. In an example embodiment, the error correction block may be provided as an element of the memory controller 1200.

The host interface 1240 may exchange commands, addresses, and data between the memory controller 1200 and the host 2000. For example, the host interface 1240 may receive a request, an address, and data from the host 2000, and may output data that is read from the memory device 1100 to the host 2000. The host interface 1240 may communicate with the host 2000 using a protocol such as a Peripheral Component Interconnect-express (PCI-e), Advanced Technology Attachment (ATA), Serial ATA (SATA), Parallel ATA (PATA), Serial Attached SCSI (SAS) or Nonvolatile Memory express (NVMe) protocol. The host interface 1240 is not limited to the above-described examples, and may include various interfaces, such as Universal Serial Bus (USB), Multi-Media Card (MMC), Enhanced Small Disk Interface (ESDI), or Integrated Drive Electronics (IDE) interfaces.

The buffer memory interface 1250 may transfer data between the central processing unit 1220 and a buffer memory (e.g., 1300 of FIG. 1). When the buffer memory 1300 is included in the memory controller 1200, the buffer memory interface 1250 may be omitted.

The memory interface 1260 may exchange commands, addresses, and data between the memory controller 1200 and the memory device 1100. For example, the memory interface 1260 may transmit commands, addresses, data, and the like to the memory device 1100 through a channel, and may receive data and the like from the memory device 1100.

Figure 16:
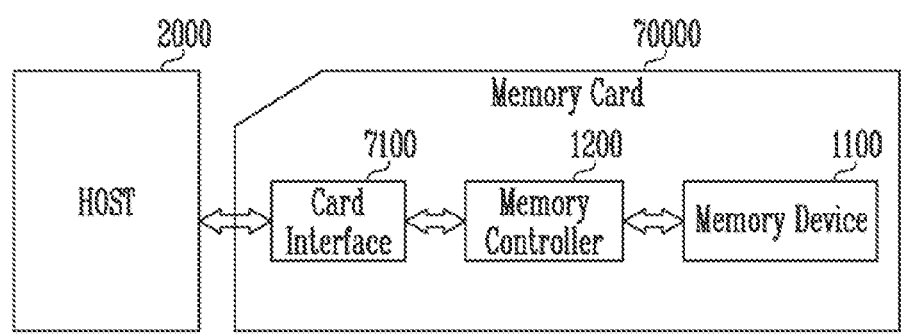
FIG. 16 is a diagram illustrating an embodiment of a memory system including a memory device having the control memory configuration of FIGS. 10 and 11.

FIG. 16 is a diagram illustrating an embodiment of a memory system including a memory device having the control memory configuration of FIGS. 10 and 11.

Referring to FIG. 16, the memory system may include a host 2000 and memory card 70000.

The memory card 70000 may be implemented as a smart card. The memory card 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a mufti-media card (MMC) interface. Further, the card interface 7100 may interface data exchange between the host 2000 and the memory controller 1200 according to a protocol of the host 2000. In an embodiment, the card interface 7100 may support a universal serial bus (USB) protocol and an interchip (IC)-USB protocol. Here, the card interface 7100 may refer to hardware capable of supporting a protocol which is used by the host 2000, software installed in the hardware, or a signal transmission scheme supported by the hardware.

The present disclosure may provide a memory device that can efficiently utilize storage space and a method of operating the memory device.

What is claimed is:

1. A memory device, comprising:
    a memory cell array including multiple planes;
    a peripheral circuit configured to perform an operation on the multiple planes;
    a control memory configured to store control codes for controlling the peripheral circuit; and
    a plurality of independent control logic configured to, when a command corresponding to each of the planes is received from a memory controller, control the peripheral circuit with reference to a control code corresponding to the command in response to the command,
    wherein the control memory comprises:
    a common memory configured to be accessible in common by the plurality of independent control logic; and
    a temporary storage including areas respectively corresponding to the planes, and
    wherein each of the independent control logic is configured to:
    when the control code corresponding to the command is present in the temporary storage, access the temporary storage and acquire the control code from the temporary storage; and
    when the control code corresponding to the command is not present in the temporary storage, access the common memory and acquire the control code from the common memory.

2. The memory device according to claim 1, wherein each of the independent control logic is configured to:
    store the control code acquired from the common memory in one of the areas of the temporary storage, or
    store a control code acquired from one of the areas of the temporary storage in one of remaining areas of the temporary storage.

3. The memory device according to claim 1, wherein:
    the command is a command indicating a plane-interleaved read operation on the planes, and
    the command includes at least one of a least significant bit (LSB) read command, a center significant bit (CSB) read command, and a most significant bit (MSB) read command for each of the planes.

4. The memory device according to claim 3, wherein the control code includes at least one of a control code for performing an LSB page read operation corresponding to the LSB read command, a control code for performing a CSB page read operation corresponding to the CSB read command, and a control code for performing an MSB page read operation corresponding to the MSB read command.

5. The memory device according to claim 3, wherein the common memory includes:
    a main area configured to store a control code for performing at least one of a program operation, a read operation, and an erase operation; and
    a sub-area configured to store a control code corresponding to the plane-interleaved read operation.

6. The memory device according to claim 1, wherein each of the areas comprises a shift register.

7. The memory device according to claim 1, wherein the plurality of independent control logic comprise:
    first independent control logic configured to store the control code acquired from the common memory in a first area, among the areas, and to control the peripheral circuit so that an operation on a first plane, among the multiple planes, is performed with reference to the control code stored in the common memory, and
    second independent control logic configured to control the peripheral circuit so that an operation on a second plane, among the multiple planes, is performed with reference to the control code stored in the first area before the operation on the first plane is terminated.

8. The memory device according to claim 7, wherein the control code stored in the first area is a control code for performing an operation, identical to the operation performed on the second plane, on the first plane.

9. A method of operating a memory device including multiple planes, comprising:
    receiving a command indicating an operation on one of the planes from a memory controller;
    accessing one of a common memory, configured to be accessible in common by a plurality of independent control logic, and a temporary storage and acquiring a control code corresponding to the command; and
    generating a control signal corresponding to the command with reference to the control code,
    wherein acquiring the control code is configured to:

when the control code corresponding to the command is present in the temporary storage, access the temporary storage and acquire the control code from the temporary storage; and when the control code corresponding to the command is not present in the temporary storage, access the common memory and acquire the control code from the common memory.

10. The method according to claim 9, further comprising: after acquiring the control code, storing the acquired control code in the temporary storage.

11. The method according to claim 10, wherein the temporary storage includes areas respectively corresponding to the planes.

12. The method according to claim 11, wherein each of the areas comprises a shift register.

13. The method according to claim 11, wherein storing the acquired control code in the temporary storage comprises: storing the control code in one of remaining areas other than an area from which the control code is acquired, among the areas.

14. The method according to claim 9, wherein the command includes at least one of a least significant bit (LSB) read command, a center significant bit (CSB) read command, and a most significant bit (MSB) read command.

15. The method according to claim 14, wherein the control code includes at least one of a control code for performing an LSB page read operation corresponding to the LSB read command, a control code for performing a CSB page read operation corresponding to the CSB read command, and a control code for performing an MSB page read operation corresponding to the MSB read command.

16. The method according to claim 11, wherein:
acquiring the control code comprises acquiring the control code from the common memory, and
generating the control signal comprises:
storing the control code acquired from the common memory in a first area, among the areas;
performing an operation on a first plane, among the multiple planes, with reference to the control code stored in the common memory; and
performing an operation on a second plane, among the multiple planes, with reference to the control code stored in the first area before the operation on the first plane is terminated.

17. The method according to claim 16, wherein the control code stored in the first area is a control code for performing an operation, identical to the operation performed on the second plane, on the first plane.

* * * * *